(12) United States Patent
Dean et al.

(10) Patent No.: US 6,644,481 B2
(45) Date of Patent: Nov. 11, 2003

(54) APPARATUS AND METHOD FOR RACKMOUNTING A CHASSIS

(75) Inventors: Ronald P. Dean, Fort Collins, CO (US); Sean W. Tucker, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/073,478

(22) Filed: Feb. 11, 2002

(65) Prior Publication Data

US 2003/0150823 A1 Aug. 14, 2003

(51) Int. Cl.⁷ .................................................. A47F 7/00
(52) U.S. Cl. ................... 211/26; 312/223.1; 312/348.2; 211/190
(58) Field of Search .................. 211/26, 26.2, 190–192, 211/134, 151, 187, 188, 126.15; 361/683, 724, 727, 725; 312/330.1, 223.1, 223.2, 348.1, 348.2, 257.1, 265.1, 265.2

(56) References Cited

U.S. PATENT DOCUMENTS

| | | | | |
|---|---|---|---|---|
| 3,228,532 A | * | 1/1966 | Sisk et al. ..................... 211/26 |
| 5,571,256 A | * | 11/1996 | Good et al. .................... 211/26 |
| 5,726,864 A | * | 3/1998 | Copeland et al. ........... 361/800 |
| 5,808,867 A | * | 9/1998 | Wang ........................ 361/695 |
| 6,185,092 B1 | * | 2/2001 | Landrum et al. ........... 361/683 |
| 6,201,690 B1 | * | 3/2001 | Moore et al. ................ 361/683 |
| 6,227,630 B1 | * | 5/2001 | Brown et al. ............. 312/223.2 |
| 6,256,195 B1 | * | 7/2001 | Liao ........................... 361/685 |
| 6,297,962 B1 | * | 10/2001 | Johnson et al. ............. 361/726 |
| 6,305,556 B1 | * | 10/2001 | Mayer ......................... 211/26 |
| 6,370,022 B1 | * | 4/2002 | Hooper et al. .............. 361/685 |
| 6,388,873 B1 | * | 5/2002 | Brooks et al. .............. 361/685 |
| 6,481,809 B1 | * | 11/2002 | Richardson ............... 312/223.2 |

\* cited by examiner

Primary Examiner—Daniel P. Stodola
Assistant Examiner—Jennifer E. Novosad

(57) ABSTRACT

A system and method for mounting a device into a rack comprises a mounting shelf that is attached to the rack, a first bracket that is attached to a first side of the device, and a second bracket that is attached to a second side of the device, wherein the second side is located opposite to the first side, wherein the first bracket and the second bracket are substantially similar, and wherein the device, with the first bracket and the second bracket attached thereto, is slideably positioned into the mounting shelf and attached to the mounting shelf via the first bracket and the second bracket.

37 Claims, 4 Drawing Sheets

FIG. 2

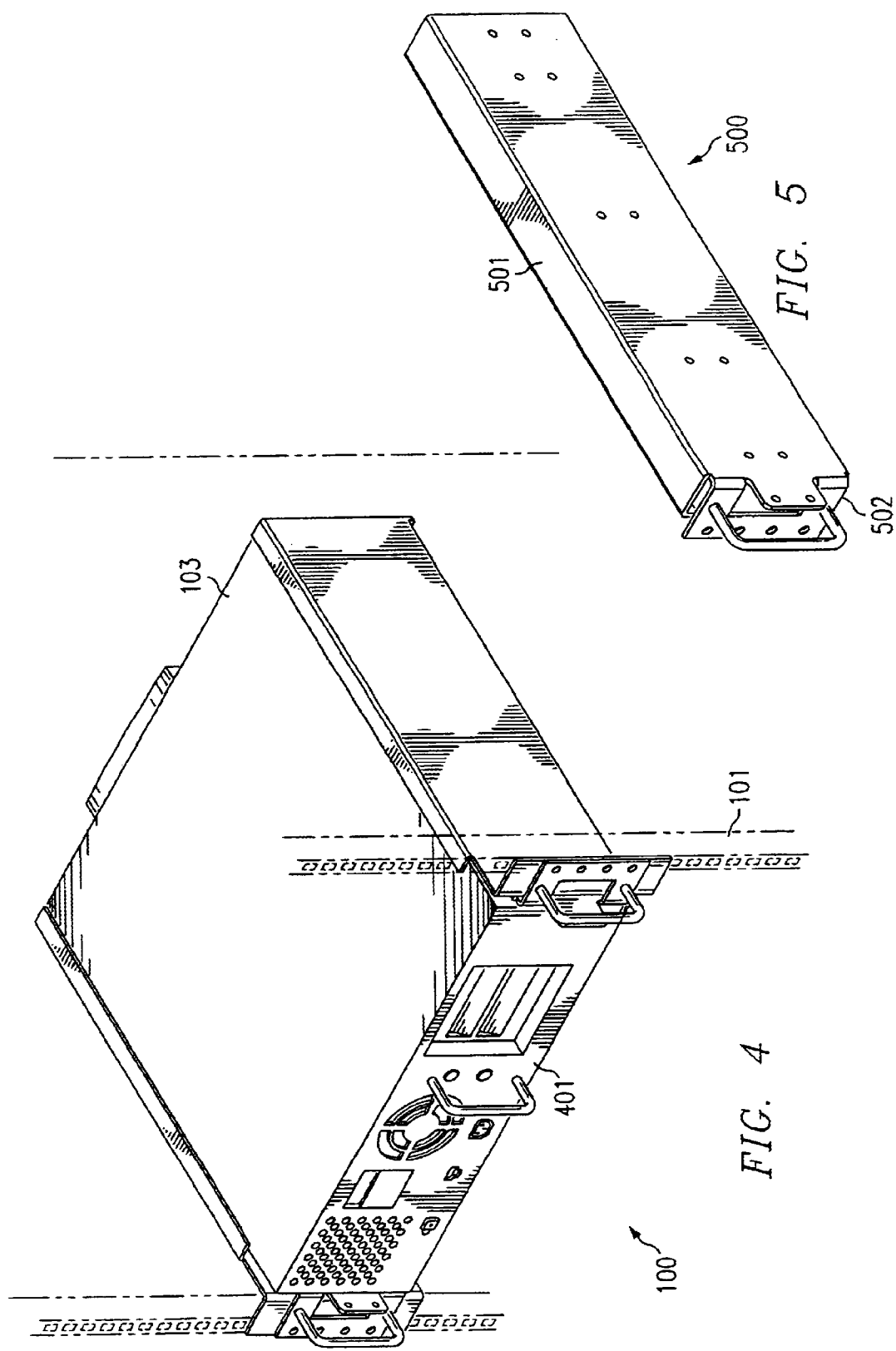

APPARATUS AND METHOD FOR RACKMOUNTING A CHASSIS

FIELD OF THE INVENTION

This invention relates in general to mounting devices, and in specific to an apparatus and method for rackmounting a chassis.

BACKGROUND OF THE INVENTION

Large-scale computer systems typically include a plurality of towers or racks of computer equipment. Each rack comprises several pieces of equipment or chassis. Each chassis may comprise a board that includes processors, memory, and/or power supplies. Other chassis might include telecommunications equipment, writing equipment, networking equipment, I/O equipment, and/or user interface equipment.

Ideally, the equipment should be removably mounted into the rack. This would allow the equipment to be easily serviced and/or installed. One way that the equipment can be removably attached to the rack is to use sliding rails that are attached to the workstation. The equipment or the chassis equipment may then be attached to the sliding rails. Thus, the chassis is supported by the sliding rails and can be moved into and out of the rack by the sliding rails, which slidably extend from the rack. The sliding rails may incorporate ball bearings to more readily facilitate the sliding action. Another way that the chassis can be slidably mounted into the rack is to use a shelf. The shelf is mounted inside the rack, and rails are provided on the shelf to guide the chassis in the shelf.

Both of these designs allow the chassis to be mounted in only one orientation. Thus, the chassis mounted so that the front of the chassis faces out of the rack; the chassis cannot be mounted so that the rear is facing out of the front of the rack, unless substantial modifications are made to the mounting system. Also, such modifications utilize parts that are not common for the left and right sides and increases the cost of the mounting kit. Note that the sliding rail design may use identical parts to comprise the rails for the left and right sides, but the assembly of these parts to form the sliding rails is different such that the sliding rails are different for the left side and the right side.

BRIEF SUMMARY OF THE INVENTION

A system for mounting a device into a rack comprising a mounting shelf that is attached to the rack, a first bracket that is attached to a first side of the device, and a second bracket that is attached to a second side of the device, wherein the second side is located opposite to the first side, wherein the first bracket and the second bracket are substantially. similar, and wherein the device, with the first bracket and the second bracket attached thereto, is slideably positioned into the mounting shelf and attached to the mounting shelf via the first bracket and the second bracket.

BRIEF DESCRIPTION OF THE DRAWINGS

FIG. 4 depicts an embodiment of the invention mounting a chassis in a rear-facing orientation.

FIG. 5 depicts an alternative embodiment of the slide bracket shown in FIG. 3.

DETAILED DESCRIPTION OF THE INVENTION

The invention preferably comprises a folded sheet metal slide bracket assembly and a folded sheet metal mounting shelf. Two slide brackets are preferably used with one slide bracket supporting the left side of the chassis and the other supporting the right side of the chassis. The rack mount shelf is preferably connected to the rack through the use of screws and mounting holes. The slide bracket is preferably attached to the chassis by screws through holes and provides alignment and final positioning of the chassis within the rack.

The slide bracket of the invention can be mounted on either side of the chassis. This allows the chassis to be mounted with either the front or rear of the chassis facing out of the front of the rack. This flexibility is desirable as some users require access to the front of the chassis, for example, to load/unload storage media, while other users prefer access to the rear of the chassis, for example, to allow connection/disconnection of cables.

After attachment of the slide brackets to the chassis, the chassis with the slide brackets is mounted onto the mounting shelf. Each slide bracket preferably includes a flange, which together are used to position the chassis on the mounting shelf. The mounting shelf preferably comprises flanges such that when the chassis is properly located on the mounting shelf, the flanges of the slide brackets align with the flanges of the mounting shelf. Fasteners or other forms of connectors can then be used to attach the slide bracket to the mounting shelf. Thus, the invention allows either front-or-rear-orientation equipment mounting and minimizes the costs of mounting by using common parts regardless of orientation.

Figure 1:
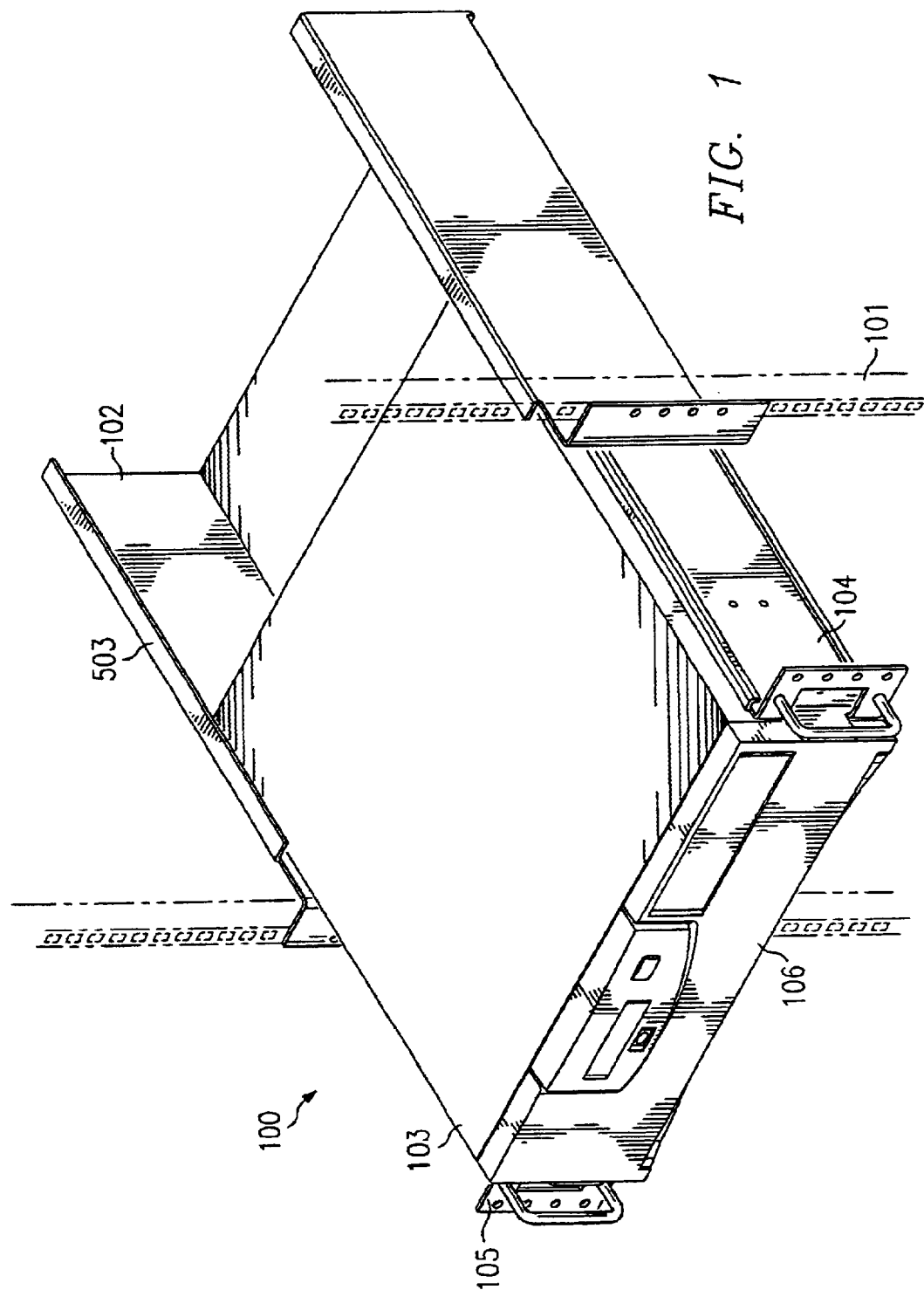
FIG. 1 depicts mounting a chassis in a front facing orientation consistent with the teachings of the invention.

FIG. 1 depicts an arrangement of the inventive rack mount 100 for mounting chassis 103 into rack 101. The inventive mount 100 includes mounting shelf 102 which supports chassis or device or equipment 103. Preferably attached to chassis 103 are two slide brackets 104, with one bracket being mounted on one side, e.g., left, and the other bracket being mounted on the other side, e.g., right. Note that the inventive rack mount 100 preferably does not include rack 101 or chassis 103.

Each slide bracket 104 preferably includes a flange 105 that is located on the front distal end of the slide bracket 104. Flange 105 is used to position the chassis within the rack. As shown in FIG. 1, chassis 103 is being installed into (or removed from) the rack 101. Flange 105 will stop the insertion of the chassis 103 when flange 105 encounters either rack 101 or mounting shelf 102. Slide bracket 104 may then be attached to either rack 101 or mounting shelf 102 via connectors such as fasteners, screws, nuts and bolts, pins, adhesives, welds, hooks and slots, keyholes and keyhole standoffs, or any combination thereof.

Mounting shelf 102 is preferably attached to rack 101 by one or more connectors 204 (FIG. 2) which could comprise one or more pins, screws, nuts and bolts, adhesives, welds, fasteners, hooks and slots, keyholes and keyhole standoffs, or any combination thereof.

Note that mounting shelf 102 may be sized so as to receive chassis 103 and be able to be attached to rack 101. Mounting shelf 102 may include adjustable supports or brackets (not shown) so as to attach to rack 101. This means that the rack 101 does not have to be sized to exactly fit chassis 103. Thus, rack 101 may be significantly larger than chassis 103. As shown in FIG. 1, the chassis is mounted into rack 101 so that the front 106 of chassis 103 is accessible at front of rack 101.

Figure 2:
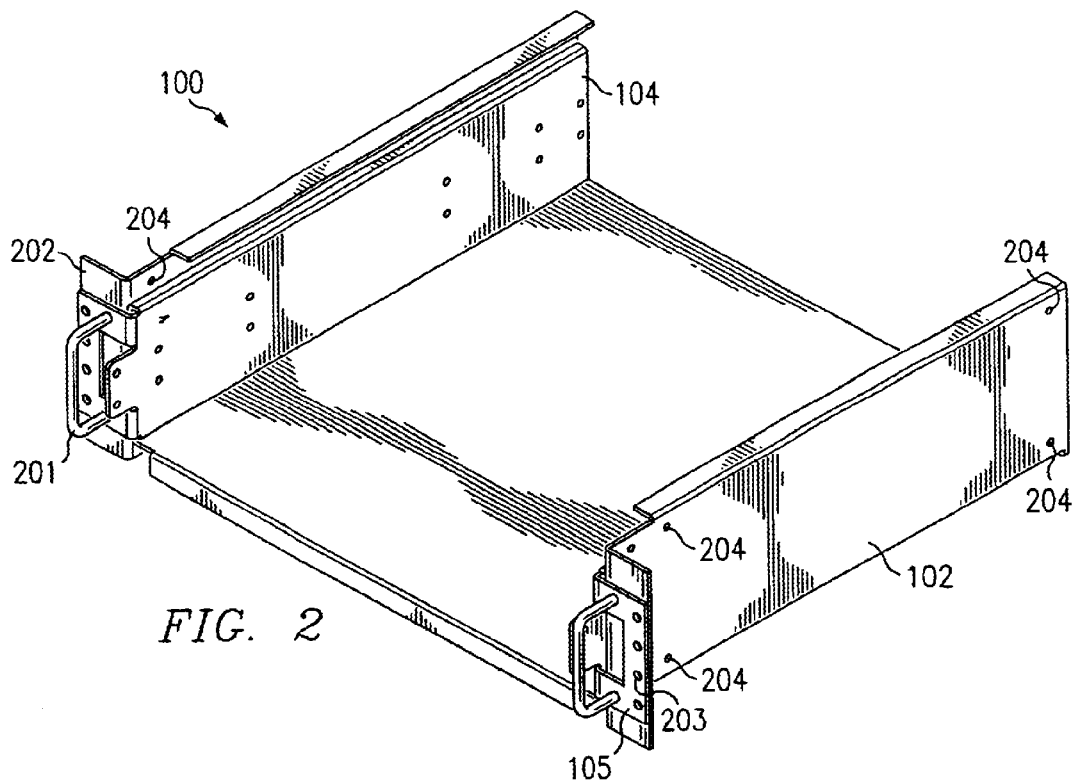
FIG. 2 depicts an embodiment of the inventive arrangement of the slide brackets and mounting shelf.

FIG. 2 depicts a view similar to that of FIG. 1 except that chassis 103 is not present for easier viewing of the components of the invention. The invention also preferably includes two handles 201, one of which is mounted on each flange 105. Handles 201 allow for chassis 103 to be more easily installed into and/or removed from the rack 101.

FIG. 2 also depicts a preferred embodiment wherein shelf 102 includes two flanges 202, each of which is located so as to contact a respective flange 105 of slide brackets 104 when the chassis 103 is properly located in rack 101. Flange 105 and flange 202 preferably have colocated holes 203 which enables a connector to securely connect the slide brackets 104, and hence, chassis 103, to mounting shelf 102.

Figure 3:
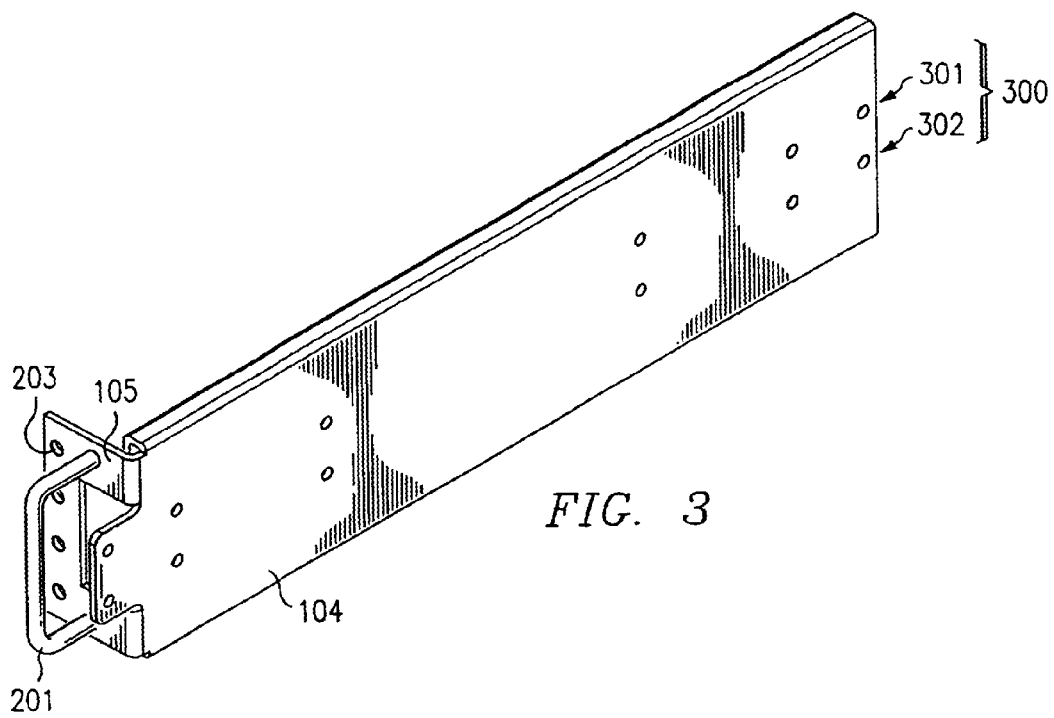
FIG. 3 depicts a slide bracket of FIGS. 1 and 2.

FIG. 3 depicts an elevational view of one of the flanges 104. Each flange 104 would preferably have a chassis mounting system that would allow the chassis 103 to be mounted in either a front orientation or a rear orientation.

In the embodiment shown in FIG. 3, mounting system 300 preferably comprises hole sets 301 and 302. Each hole set is specifically configured and placed on flange 104 to enable flange 104 to be attached to a side of chassis 103. For example, hole set 301 may enable the left side of the chassis to be attached to flange 104, while hole set 302 enables the right side of chassis 103 to be attached to flange 104. Thus, flange 104 could be attached to either side of chassis 103. Note that the mounting system 300 could comprise one or more pins, screws, nuts and bolts, adhesives, welds, fasteners, hooks and slots, keyholes and keyhole standoffs, or any combination thereof.

Note that the flange shown in FIG. 3 is oriented to attach to the left slide of chassis 103. The flange would be inverted to be attached to the right side of chassis 103.

Note that the holes 203 and hole sets 301, 302 are shown by way of example only. There could be more holes, fewer holes, holes located in different positions, different-sized holes, or whatever is needed to accommodate attachment of the flange 104 to the mounting shelf 102 or attachment with chassis 103, respectively. Further note that the connectors 204 are shown by way of example only, as there could be more connectors, fewer connectors, connectors located in different positions, different-sized connectors, or whatever is needed to accommodate attachment of the shelf 102 to rack 101.

FIG. 4 depicts an arrangement of the chassis 103 in the rack 101 such that the rear 401 of chassis 103 is located at the front of rack 101.

FIG. 5 depicts an alternative embodiment 500 of the slide bracket that can be used in arrangements of FIGS. 1, 2 and 4 in place of the slide bracket 104 shown in FIG. 3. Slide bracket 500 includes at least one additional flange, e.g. 501 and/or 502. The additional flange(s) 501, 502 increase(s) the strength of the slide bracket 500. Also, slide bracket 500 may be of sufficient height so that flange 501 interfaces with flange 503 of mounting shelf 102, and thereby provide easier mounting of the chassis into the rack. Note that bracket 104 may also be of sufficient height so that its upper portion also interfaces with flange 503.

Figure 6:
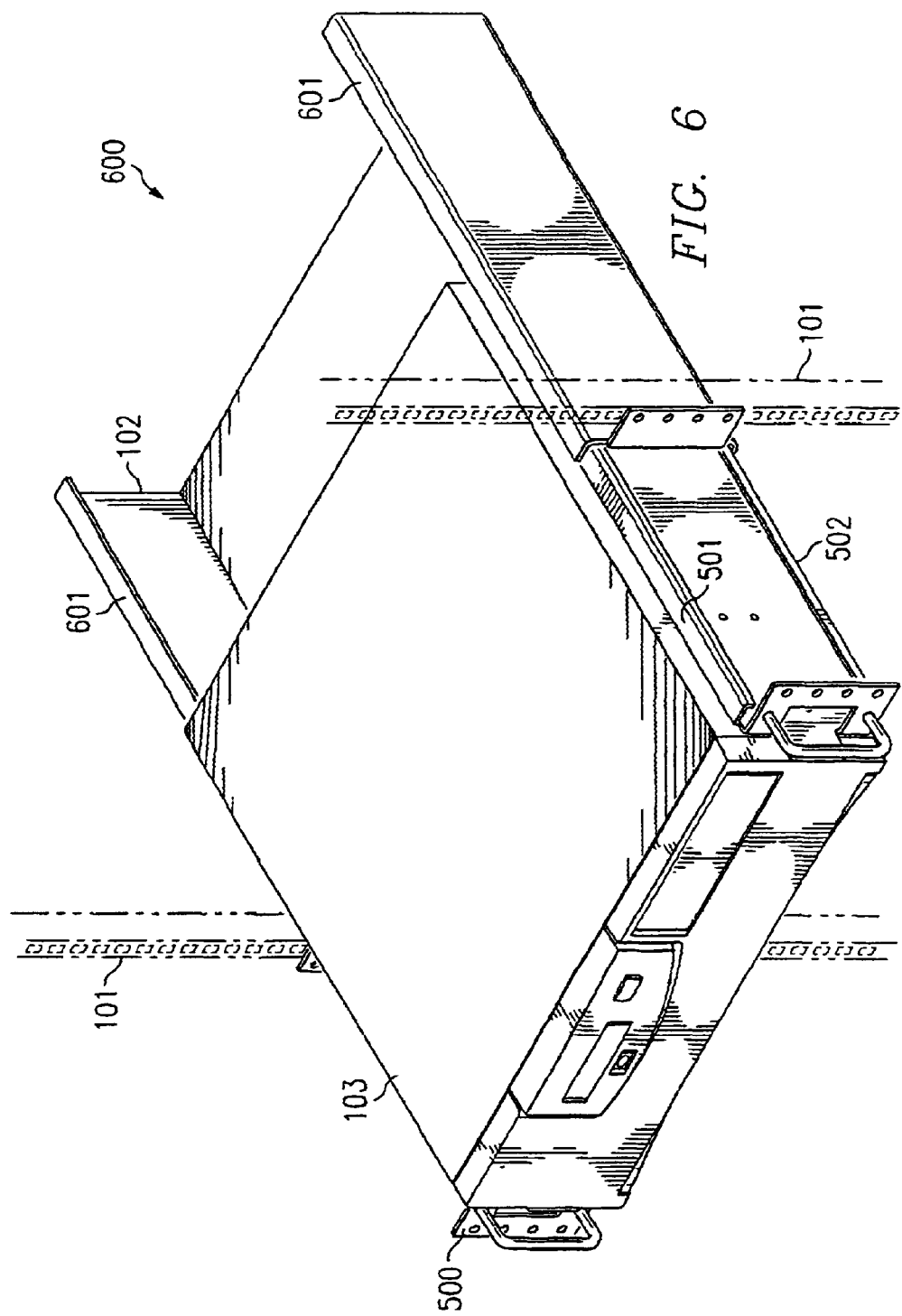
FIG. 6 depicts an alternative embodiment of the inventive arrangement using the slide bracket of FIG. 5.

FIG. 6 depicts an alternative embodiment 600 using the slide bracket 500 of FIG. 5. Note that in the embodiments shown in FIGS. 1, 2, and 4, the slide bracket does not contact the upper flange 503 of the mounting shelf 102, and the upper portion of chassis 103 may contact the upper flange 503. Thus, the height of the chassis 103 is limited by the height of the mounting shelf 102. In the alternative embodiment 600, the flange 601 of mounting shelf 102 does not contact chassis 103. The flange 601 preferably contacts the upper flange 501 of each slide bracket 500. This would prevent vertical movement of the chassis, but would allow the chassis to be of any height.

What is claimed is:

1. A system for mounting a device into a rack comprising:

a mounting shelf attached to the rack;

a first bracket attached to a first side of the device;

a second bracket attached to a second side of the device;

wherein the mounting shelf comprises two flanges that are arranged to be adjacently located with the flanges of the first and second brackets when the device is mounted in the rack;

the device, with the first bracket and the second bracket attached thereto, is slideably positionable into the mounting shelf and attachable to the mounting shelf via the first bracket and the second bracket; and wherein the flanges of the first and second brackets are adapted to be attached to the flanges of the mounting shelf via a connector selected from the group consisting of: at least one screw, at least one fastener, at least one adhesive, at least one weld, at least one nut and bolt, at least one pin, at least one hook and slot, at least one keyhole and keyhole standoff, and a combination thereof.

2. The system of claim 1, wherein:

the second side of the device is located opposite to the first side of the device.

3. The system of claim 1, wherein:

each bracket has a handle to facilitate mounting the device in the rack.

4. The system of claim 1, wherein:

the device has a front side and a rear side, and the rack has a front side, and the system facilitates mounting of the device with at least one of the front side and the rear side of the device at the front side of the rack.

5. The system of claim 1, wherein each bracket comprises:

a mechanism to facilitate attachment to at least one of the first side and the second side of the device.

6. The system of claim 5, wherein the mechanism is a first set of mounting holes and a second set of mounting holes, wherein the first set of mounting holes permits attachment of the first side of the device via a first connector, and the second set of mounting holes permits attachment of the second side of the device via a second connector.

7. The system of claim 6, wherein each of the first and second connectors are selected from the group consisting of:

at least one screw, at least one fastener, at least one adhesive, at least one weld, at least one nut and bolt, at least one pin, at least one hook and slot, at least one keyhole and keyhole standoff, and a combination thereof.

8. The system of claim 1, wherein the mounting shelf is attached to the rack by at least one connector selected from the group consisting of:

at least one screw, at least one fastener, at least one adhesive, at least one weld, at least one nut and bolt, at least one pin, at least one hook and slot, at least one keyhole and keyhole standoff, and a combination thereof.

9. The system of claim 1, wherein:

the mounting shelf contacts the device on a third side.

10. A method for mounting a device into a rack comprising:

attaching a mounting shelf to the rack;

attaching a first interchangeable bracket to a first side of the device;

attaching a second interchangeable bracket to a second side of the device;

slideably positioning the device, with the first bracket and the second bracket attached thereto, onto the mounting shelf wherein slideably positioning the device comprises positioning the device so that flanges of the mounting shelf are adjacently located with flanges of the first and second brackets; and attaching the device to the mounting shelf via the first bracket and the second bracket wherein attaching the device to the mounting shelf comprises: attaching the flanges of the first and second brackets to the flanges of the mounting shelf via a connector selected from the group consisting of: at least one screw, at least one fastener, at least one adhesive, at least one weld, at least one nut and bolt, at least one pin, at least one hook and slot, at least one keyhole and keyhole standoff, and a combination thereof.

11. The method of claim 10, wherein slideably positioning the device comprises:

using a handle on at least one of the brackets to facilitate mounting of the device with rack.

12. The method of claim 10, further comprising:

orienting the device such that one of a front side and a rear side of the device faces a front side of the rack when the device is mounted in the rack.

13. The method of claim 10, wherein each bracket has a mechanism to facilitate attachment to at least one of the first side and the second side of the device.

14. The method of claim 13, wherein the mechanism is a first set of mounting holes and a second set of mounting holes; and wherein:

attaching the first bracket to the first side of the device comprises:

using the first set of mounting holes for attachment to the first side of the device via a first connector; and attaching the second bracket to the second side of the device comprises:

using the second set of mounting holes for attachment to the second side of the device via a second connector.

15. The method of claim 14, further including selecting the first and second connectors from the group consisting of:

at least one screw, at least one fastener, at least one adhesive, at least one weld, at least one nut and bolt, at least one pin, at least one hook and slot, at least one keyhole and keyhole standoff, and a combination thereof.

16. The method of claim 10, wherein attaching the mounting shelf to the rack uses at least one connector selected from the group consisting of: at least one screw, at least one fastener, at least one adhesive, at least one weld, at least one nut and bolt, at least one pin, at least one hook and slot, at least one keyhole and keyhole standoff, and a combination thereof.

17. The method of claim 10 wherein:

the mounting shelf contacts the device on a third side.

18. A system for mounting a device into a rack comprising:

a mounting shelf attached to the rack;

a first bracket attached to a first side of the device; and a second bracket attached to a second side of the device;

wherein the first bracket and the second bracket are interchangeable; and the device, with the first bracket and the second bracket attached thereto, is slideably positionable into the mounting shelf, which contacts the device on a third side, and is attachable to the mounting shelf via the first bracket and the second bracket.

19. The system of claim 18, wherein:

the second side of the device is located opposite to the first side of the device.

20. The system of claim 18, wherein:

each bracket has a-handle to facilitate mounting the device in the rack.

21. The system of claim 18, wherein:

each bracket has a flange that facilitates positioning the device in the rack.

22. The system of claim 21, wherein:

the mounting shelf comprises two flanges that are arranged to be adjacently located with the flanges of the first and second brackets when the device is mounted in the rack.

23. The system of claim 22, wherein the flanges of the first and second brackets are adapted to be attached to the flanges of the mounting shelf via a connector selected from the group consisting of:

at least one screw, at least one fastener, at least one adhesive, at least one weld, at least one nut and bolt, at least one pin, at least one hook and slot, at least one keyhole and keyhole standoff, and a combination thereof.

24. The system of claim 18, wherein:

the device has a front side and a rear side, and the rack has a front side, and the system facilitates mounting of the device with at least one of the front side and the rear side of the device at the front side of the rack.

25. The system of claim 18, wherein each bracket comprises:

a mechanism to facilitate attachment to at least one of the first side and the second side of the device.

26. The system of claimed 18, wherein the mechanism is a first set of mounting holes and a second set of mounting holes, wherein the first set of mounting holes permits attachment of the first side of the device via a first connector, and the second set of mounting holes permits attachment of the second side of the device via a second connector.

27. The system of claim 26, wherein each of the first and second connectors are selected from the group consisting of:

at least one screw, at least one fastener, at least one adhesive, at least one weld, at least one nut and bolt, at least one pin, at least one hook and slot, at least one keyhole and keyhole standoff, and a combination thereof.

28. The system of claim 18, wherein the mounting shelf is attached to the rack by at least one connector selected from the group consisting of:

at least one screw, at least one fastener, at least one adhesive, at least one weld, at least one nut and bolt, at least one pin, at least one hook and slot, at least one keyhole and keyhole standoff, and a combination thereof.

29. A method for mounting a device into a rack comprising:
   attaching to the rack a mounting shelf;
   attaching a first interchangeable bracket to a first side of the device;
   attaching a second interchangeable bracket to a second side of the device;
   slideably positioning the device, with the first bracket and the second bracket attached thereto, onto the mounting shelf, contacting the mounting shelf on a third side; and
   attaching the device to the mounting shelf via the first bracket and the second bracket.

30. The method of claim 29, wherein slideably positioning the device comprises:
   using a handle on at least one of the brackets to facilitate mounting of the device with rack.

31. The method of claim 29, wherein slideably positioning the device comprises:
   positioning the device so that flanges of the mounting shelf are adjacently located with flanges of the first and second brackets.

32. The method of claim 31, wherein attaching the device to the mounting shelf comprises:
   attaching the flanges of the first and second brackets to the flanges of the mounting shelf via a connector selected from the group consisting of: at least one screw, at least one fastener, at least one adhesive, at least one weld, at least one nut and bolt, at least one pin, at least one hook and slot, at least one keyhole and keyhole standoff, and a combination thereof.

33. The method of claim 29, further comprising:
   orienting the device such that one of a front side and a rear side of the device faces a front side of the rack when the device is mounted in the rack.

34. The method of claim 29, wherein each bracket has a mechanism to facilitate attachment to at least one of the first side and the second side of the device.

35. The method of claim 34, wherein the mechanism is a first set of mounting holes and a second set of mounting holes; and wherein:
   attaching the first bracket to the first side of the device comprises:
   using the first set of mounting holes for attachment to the first side of the device via a first connector; and
   attaching the second bracket to the second side of the device comprises:
   using the second set of mounting holes for attachment to the second side of the device via a second connector.

36. The method of claim 35, further including selecting the first and second connectors from the group consisting of:
   at least one screw, at least one fastener, at least one adhesive, at least one weld, at least one nut and bolt, at least one pin, at least one hook and slot, at least one keyhole and keyhole standoff, and a combination thereof.

37. The method of claim 29, wherein attaching the mounting shelf to the rack uses at least one connector selected from the group consisting of: at least one screw, at least one fastener, at least one adhesive, at least one weld, at least one nut and bolt, at least one pin, at least one hook and slot, at least one keyhole and keyhole standoff, and a combination thereof.

* * * * *